United States Patent [19]
Crandell

[11] Patent Number: 6,007,292
[45] Date of Patent: Dec. 28, 1999

[54] WORK PIECE TRANSFER APPARATUS

[76] Inventor: Rod Crandell, 1270 S. McQueen Rd., Chandler, Ariz. 85249

[21] Appl. No.: 09/022,346

[22] Filed: Feb. 11, 1998

[51] Int. Cl.$^6$ ...................................................... B66C 23/00
[52] U.S. Cl. .................................... 414/744.6; 74/490.05; 414/749; 901/12
[58] Field of Search ..................... 414/749, 744.1–744.6; 74/490.01, 490.05, 490.06; 901/15, 12, 11, 28, 29

[56] References Cited

U.S. PATENT DOCUMENTS

| | | | |
|---|---|---|---|
| 4,483,654 | 11/1984 | Koch et al. | 414/744.5 |
| 4,584,045 | 4/1986 | Richards . | |
| 4,728,522 | 3/1988 | Lada et al. | 414/749 |
| 4,801,235 | 1/1989 | Rauschdorf . | |
| 4,955,780 | 9/1990 | Shimane . | |
| 5,151,008 | 9/1992 | Ishida . | |
| 5,333,986 | 8/1994 | Mizukami . | |

*Primary Examiner*—Donald W. Underwood
*Attorney, Agent, or Firm*—LaValle D. Ptak

[57] ABSTRACT

A work piece transfer system particularly suited for transferring semi-conductor wafers from one environment, through a loadlock, to another environment and back again employs a series of pivotally interconnected levers located within the loadlock when the device is in its central collapsed position. Only a single shaft extends through the loadlock, the main drive shaft for operating the device. The lever arm, which is attached to the input shaft for rotation with it, has a hole through its center for pivotally supporting a composite lever arm half of which is located above the first lever arm, and the other half of which is located below the lever arm, with the two portions connected by a pin passing through a hole in the center of the first lever arm. The work piece is pivotally attached to the opposite end of the first lever arm; and an interconnecting lever arm is pivotally attached between one end of the composite lever arm and an intermediate pivot on the work piece. The composite lever arm also has a primary pivot which is slidably located in a channel or groove aligned with the axis of the input drive shaft; so that as the drive shaft rotates, this pivot slides in the groove to different locations establishing the overall positioning of the work piece support member to one or the other of two sides of the central position located in the loadlock.

14 Claims, 2 Drawing Sheets

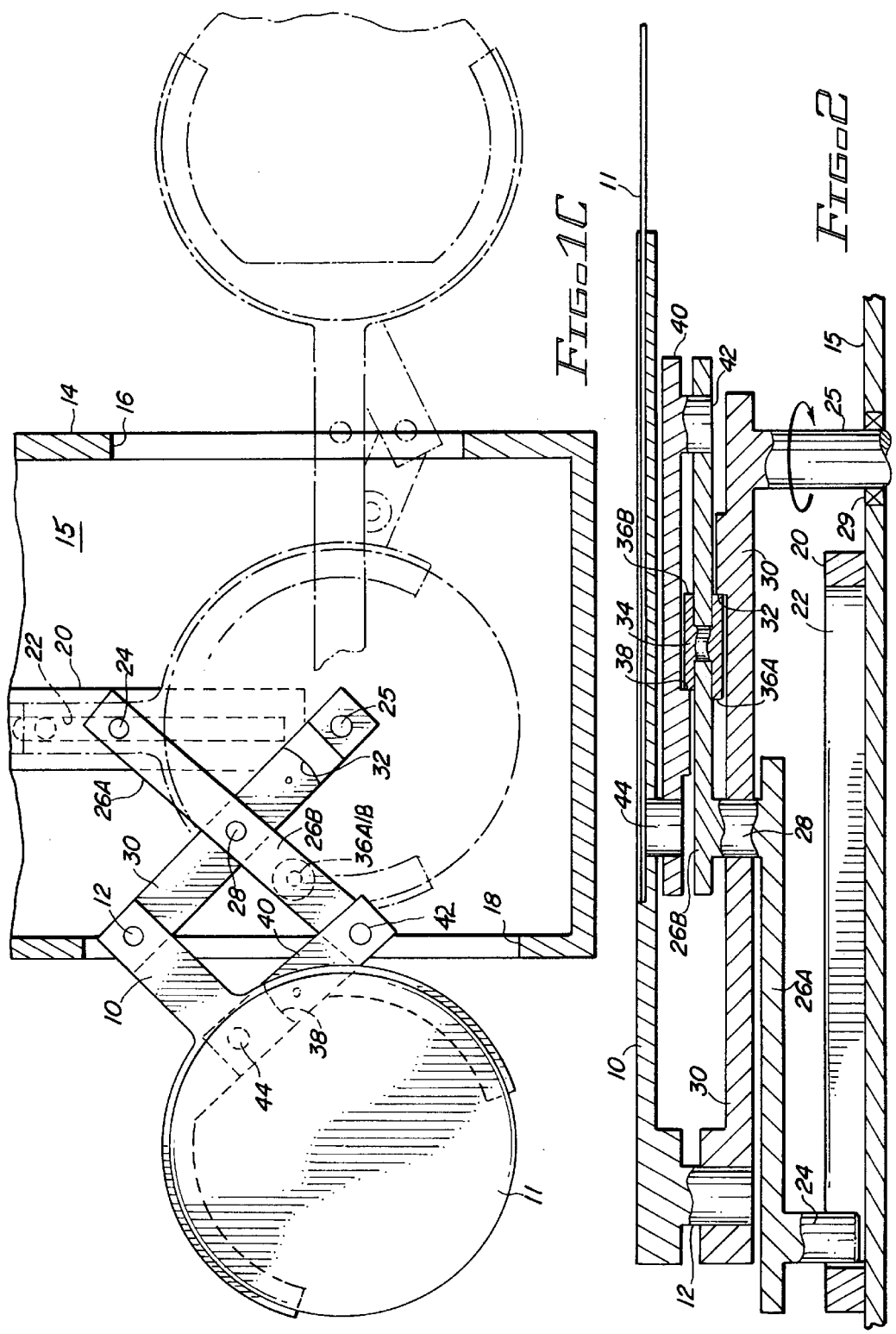

WORK PIECE TRANSFER APPARATUS

BACKGROUND

Precision material handling devices are required in a number of industries. In particular, the handling of semiconductor wafers at various stages of processing, and the handling of integrated circuit chips after they have been processed from such wafers, requires sophisticated automated handling equipment.

With respect to the handling of semi-conductor wafers, devices are required for moving a wafer from one location through a loadlock (or air lock) to another location, as part of the processing of such wafers in the manufacture of integrated circuit chips. The placement of the wafers throughout the transfer must be precise because of the processing steps which are carried out in the different environments or chambers on opposite sides of the loadlock. Loadlocks or air locks are used to isolate one environment from the other during the processing of the semiconductor wafers.

Because of the nature of the transfer, it is necessary to precisely extend the wafers alternately on two different sides of the loadlock, beyond the loadlock itself, while fully enclosing the wafers and the transfer mechanism within the loadlock as an intermediate step. The use of loadlocks in the processing of semiconductor wafers differs in many respects from larger loadlocks of the type used in space vehicles, manufacturing clean rooms, and the like. The loadlocks which are employed in the processing of semiconductor wafers are used in conjunction with handling equipment for handling very thin, lightweight circular or disk-shaped work pieces having thicknesses in the range of 0.010 to 0.050 inches and diameters measured in inches. Because the processing of the wafers requires them to be free from contamination, the loadlocks, as well as the apparatus used within them, needs to be as free as possible from contaminants and from components which produce contaminants.

The U.S. Pat. No. 4,483,654 to Koch discloses one type of semi-conductor wafer transfer mechanism for transferring wafers from one environment, through a loadlock, to another environment. The mechanism of this patent includes a three-piece gear-driven mechanism. A central drive gear operates through an intermediary or idler gear to rotate a driven gear for effecting rotational positions of lever arms to transport the wafer from a first position in one environment to a second intermediate position within the loadlock, to a third position in another environment on the opposite side of the loadlock chamber. While the mechanism which is disclosed in this patent is capable of relatively rapidly transferring the wafer from one or the other of the two environments to the loadlock and out again, contamination can take place during the isolation vacuum step of operation when the work piece is in the loadlock. This occurs as a result of the wear of the gears involved in the mechanism. Constant wear takes place on these gears, which subjects the interior of the loadlock chamber to minute particle (dust-like) transfers as a result of the wear. In addition, as the gears wear, undesirable play takes place in the transfer mechanism, which cannot be tolerated in the delivery of the wafer to its final processing position on one side or the other of the loadlock.

Another patent for transferring semi-conductor wafers employing a rotary driving source is the U.S. Pat. No. 5,333,986 to Mizukami. The system disclosed in the Mizukami patent inherently has twice the potential for vacuum leaks over the one disclosed in the Koch patent described above. In the Koch system, only a single shaft passes through the loadlock chamber to operate the mechanism located within the chamber. In Mizukami, two shafts extend through the loadlock or vacuum chamber. One of these is the driven rotating shaft (which must be sealed, and the other is an idler rotating shaft (which also must be sealed). Both of these shafts pass through the base or bottom of the chamber. Whenever a seal in a shaft fails, the entire transfer mechanism is down. In the case of Mizukami, there is twice the opportunity for such a failure.

The Mizukami patent employs a parallelogram positioning device utilizing a pair of stainless steel belts to transfer the rotary motion of the input to the different positions of the wafer holding arms. The belt transmission mechanism has low friction between the pulleys and the belts; and there is no gear wear in the system of this patent, as contrasted with the system disclosed in the Koch patent. Typically, however, stainless steel flat belts often involve a large number of strands of wire in the belt in order to obtain the desired flexibility. Internal friction between the strands generates particulate contaminants much in the same way as the wear of the gears described above in conjunction with the Koch patent. The belts of Mizukami must be sufficiently tight to prevent any undesirable play in the overall system which could affect the placement positioning of the wafers and cause a jerky or choppy motion in the wafer positioning arm. If the belts, however, are too tight, internal wear is increased. This is true, either with a flat belt or with a wire rope. Another disadvantage of the apparatus disclosed in Mizukami is that while the system has a fairly extended reach in one direction, in the opposite direction the reach is considerably less.

Another device for handling work pieces is disclosed in the U.S. Pat. No. 4,801,235 to Rauschdorf. This patent employs a rotary drive to produce a linear movement through an arc of travel. The device disclosed in this patent is not a wafer transfer mechanism; so that it does not have a small loadlock chamber of the type typically used with such mechanisms. There also is no linear tracking; and it appears that there is no intention to stop the system operation at some intermediate or "center" position. Rauschdorf does not appear to be concerned with smoothly moving work pieces, but simply moving work pieces from one position to another. With wear at the various pivot points in the Rauschdorf apparatus, the transition through the center position may not be a smooth transition.

Additional U.S. Pat. No. 4,585,045 to Richards; U.S. Pat. No. 4,955,780 to Shimane; and U.S. Pat. No. 5,151,008 to Ishida disclose the uses of belt drives or gear drives in wafer positioning transport apparatus. In the device of the Richards patent, an inherent problem exists through the use of a spring in one of the arms of the transfer mechanism. As the belt wears or stretches, the spring extends the arm to keep the belt tight. This alters placement of the semiconductor wafer in the chamber. As mentioned previously, wafer positioning devices necessarily must be very accurate in the positioning at all stages of operation of the device. Such a wear, which alters placement, is undesirable.

The patent to Shimane employs multiple belts. This involves the potential for much fretting or wear, producing contaminants. In addition, as the belts wear or stretch, they need to be replaced on a regular basis, both in order to maintain the accuracy of the operation of the device, as well as to keep the number of contaminating particulates down within the apparatus. Replacement of belts produces additional maintenance costs and undesirable down time for the system.

The system disclosed in the Ishida patent involves a number of bearing seals, and includes multiple gears which can wear and fret, as described above, to produce contaminants. Again, as discussed previously, when there are more bearing seals in a system, the potential for failure of a seal, and therefore down time for repair of the apparatus, increases directly with the number of seals involved. Another very complex wafer transport mechanism is disclosed in the U.S. Pat. No. 4,728,252 to Lada. The device of this patent has one shaft sealed within another shaft, which rotates independently of the outer shaft. This complex seal mechanism inherently exposes the device to potential failure and fretting. Also, the device employs belts and requires two motors and two motor control circuits, with the attendant wire harness and the like. The complexity of this device makes it expensive; and the problems associated with belt drives located within a loadlock chamber, as described above, also are present with the device of this patent.

It is desirable to provide an accurate wafer transfer mechanism for transferring a wafer or work piece from one environment, through a loadlock, to another environment, which overcomes the disadvantages of the prior art devices discussed above, and which is simple and accurate in its operation.

SUMMARY OF THE INVENTION

It is an object of this invention to provide an improved work piece transfer system.

It is another object of this invention to provide an improved work piece transfer system for accurately transferring and positioning work pieces from one position to one or more other positions.

It is an additional object of this invention to provide a simple, accurate work piece transfer system utilizing pivoted interconnected lever arms operated from a single rotating drive input.

It is a further object of this invention to provide an improved work piece transfer system employing pivoted levers operating from a single rotary drive, which produces smooth starts and stops between different positions and which exhibits minimal potential wear of the various parts used.

In accordance with a preferred embodiment of the invention, a work piece transfer system includes a housing with a base and first and second sides. An input drive shaft has an axis mounted for rotation in the base of the housing. A first lever arm has one end secured to rotate with the drive shaft. This lever arm has a hole through it substantially at the center. A work piece support member is pivotally attached to the second end of the first lever arm. A second lever arm with first and second ends is located adjacent a first surface of the first lever arm; and it is secured to a support pin which pivotally extends through the hole in the first arm. This second lever arm also has a guide pin extending from the second end into an elongated guide groove in the base of the housing. A third lever arm is located adjacent a second surface of the first lever arm. This third lever arm is attached to the support pin extending through the hole in the first lever arm. The second and third lever arms together form a composite rigid lever arm, which has one portion below the first lever arm and another portion above the first lever arm. The two portions pivot together through the hole in the first lever arm. Finally, a fourth lever arm is located between the third lever arm and the work piece support member, with one end pivotally attached to one end of the third lever arm. The other end of the fourth lever arm is pivotally attached to the work piece support member. Rotation of the input drive shaft in one direction from a central position causes the work piece support member to move laterally to one side of the central position; and rotation of the drive shaft in the opposite direction causes the work piece support member to move to the opposite side of the central position.

BRIEF DESCRIPTION OF THE DRAWINGS

FIGS. 1A, 1B and 1C comprise top views of a preferred embodiment of the invention in three different stages of operation; and FIG. 2 is a cross-sectional view taken along the line 2—2 of FIG. 1B.

DETAILED DESCRIPTION

Figure 1A:
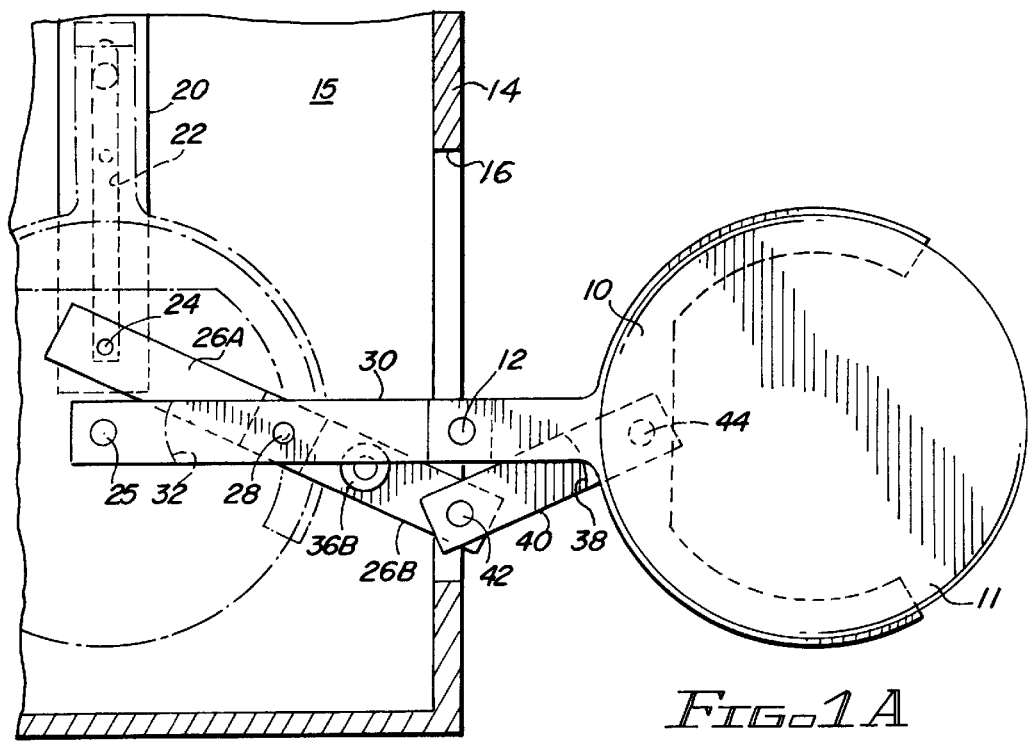

Reference now should be made to the drawings, in which the same reference numbers are used throughout the different figures to designate the same components. The system which is disclosed constitutes a work piece transfer system primarily designed for transferring semi-conductor wafers from one environment, through a loadlock, to another environment in order to accomplish processing steps on the wafer. The overall procedure for transferring semiconductor wafers from one environment to another, through a loadlock, is well known. As a consequence, the loadlock or air lock chamber and the manner in which it is operated in conjunction with the different environment chambers on opposite sides of the loadlock is not shown in detail in the various figures of the drawings. Only general portions of a loadlock 14 are illustrated in the drawings, sufficient to show the manner in which the transfer system of the invention operates in conjunction with a loadlock.

Figure 1B:
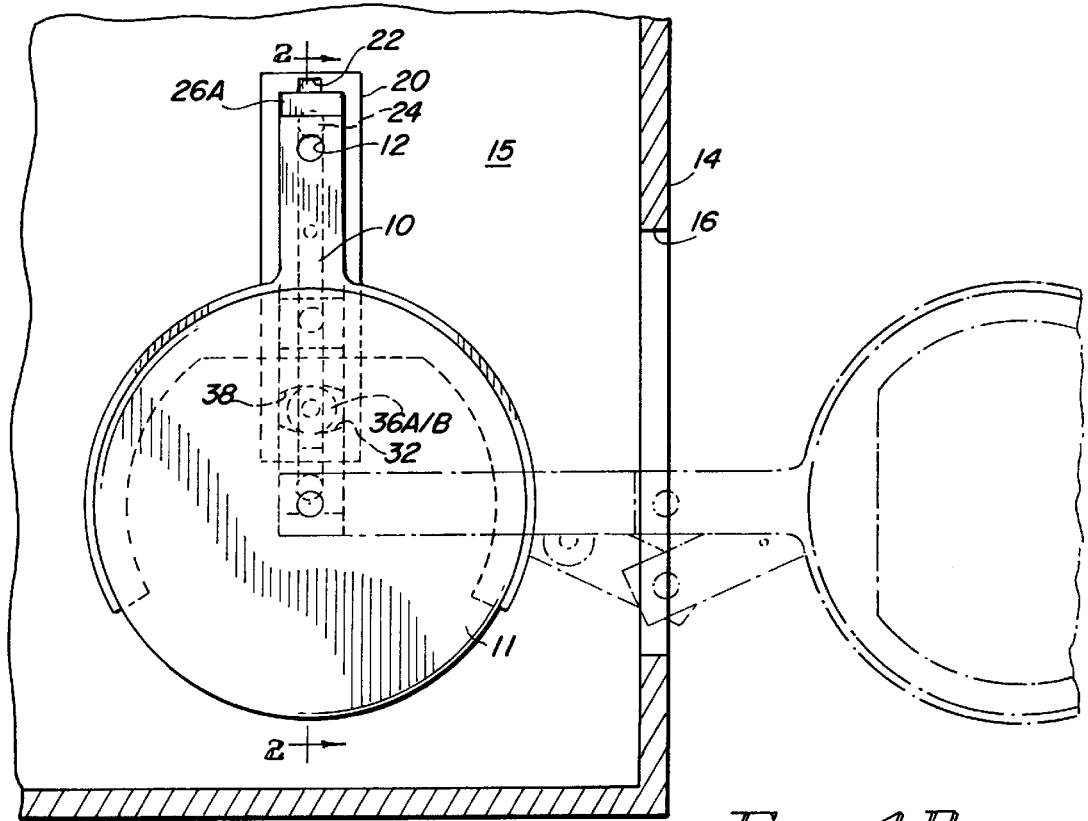

As shown in FIGS. 1A, 1B and 1C, a loadlock 14 has openings or apertures 16 and 18 on opposite sides. This is shown most clearly in FIG. 1C. The bottom 15 of the loadlock has an elongated bar 20 extending upwardly from the bottom, as shown most clearly in FIG. 2, with a narrow elongated longitudinal groove 22 located in the bar 20. Each of FIGS. 1A, 1B and 1C show these relative parts, with the groove or channel 22 shown in dotted lines.

In FIG. 2, the groove 22 is illustrated in the cross-sectional view to show the side wall on one side of it extending upwardly from the bottom 15 of the loadlock chamber 14. A wafer holding arm 10 is designed to support a semi-conductor wafer 11 as the wafer 11 is moved between three different positions (all three of which are illustrated in FIG. 1C). FIGS. 1A, 1B and 1C illustrate, in solid lines, the three different positions of the wafer support arm 10, which are employed in the operation of the transfer system.

FIG. 1B and FIG. 2 illustrate the position of the various components of the transfer system when the wafer 11 is supported by the holding arm 10 in a central or neutral position located entirely within the loadlock 14. When the apparatus is in the relative position shown in FIGS. 1B and 2, the loadlock 14 is operated (by means not shown) to close the openings 16 and 18; so that the environment within the loadlock 14 may be evacuated. Then the environment on a selected side of the loadlock 14 may be introduced to the interior of the loadlock prior to transferring the wafer or work piece holding arm 10 to the selected one or the other of the two sides illustrated in FIGS. 1A and 1C.

As shown most clearly in FIG. 2, the entire mechanism is driven by a rotary drive shaft 25, which extends through a bearing 29 in an opening in the bottom 15 of the loadlock chamber. The mechanism for rotating the shaft 25 is not shown, since a standard drive mechanism may be employed. All that is necessary is that the drive mechanism be capable of rotating the shaft 25 in either direction to effect the operations which are described subsequently. Any suitable drive motor (electrical, pneumatic or hydraulic) may be employed, along with suitable control mechanism for effecting the desired amount of rotation of the shaft 25 under control of an operating system, also not shown, which may be of any standard type.

The top of the shaft 25 has an elongated lever arm 30 secured to it. The lever arm 30 has a circular opening in it, substantially at its center, and another opening at the left-hand end (opposite the end supported on the shaft 25) to which a pivot pin 12 is rotatably attached. The pivot 12 is secured in a non-pivoting fashion to the end of the wafer support arm 10; so that the arm 10 is free to pivot on the pivot 12 in the end of the lever 30.

Overall control of the position mechanism is effected through a second stepped or composite lever arm 26A/26B, the two parts of which are located adjacent opposite surfaces of the lever arm 30. The parts 26A and 26B are interconnected by a pin 28 which secures the parts 26A and 26B together to form a single elongated lever. The pin 28 is free to rotate in the hole at the center of the lever arm 30. At the left-hand end (as viewed in FIG. 2) of the arm portion 26A, a depending pin 24 extends into the groove or channel 22 to slide from the leftmost extreme position shown in FIG. 2 toward the right, or toward the bottom in FIG. 1B, as the shaft 25 is rotated in either direction.

An additional lever arm 40 is rotatably secured through a pivot 42 to the right-hand end of the lever arm portion 26B. The arm 40 also is pivotally attached through a pivot 44 to an intermediate point on the holding arm 10.

When the device is in its collapsed or consolidated position, as shown in FIGS. 1B and 2, a pair of resilient wheels 36A and 36B, which operate as a single wheel on a common shaft 34 rotatably attached at the midpoint of the lever arm 26B, press against a depending shoulder 38 on the lever arm 40 and against an upwardly extending shoulder 32 on the lever arm 30, as shown most clearly in FIG. 2. The wheel portions 36A and 36B preferably are made of a resilient polymer material.

When the device is in the position shown in FIGS. 1B and 2, a slight compression of the edge of the wheel portion 36B occurs against the shoulder 38; and a similar slight compression of the edge of the wheel portion 36A occurs against the shoulder 32 to hold the device in place in a non-oscillatory manner. The relative positions of the shoulders 32 and 38 with the wheel portions 36A/36B are shown most clearly in the top view of FIG. 1B.

When it is desired to move the support arm 10 out of the loadlock chamber toward the right, as shown in FIG. 1A, the shaft 25 is rotated in the clockwise direction (as viewed from the top in FIG. 1A) to rotate the lever arm 30 90° to the position shown in FIG. 1A. When this occurs, the action which takes place between the lever arms 26A/26B and 30 in conjunction with the lever arm 40 causes the apparatus to pivot to the position shown in FIG. 1A. The pivot pin 24 moves toward the extreme right-hand end of the channel or groove 22 (as shown in FIG. 2). This also is indicated in FIG. 1A. The relative positions of the various lever arms of the devices 10, 40, 30 and 26A/26B assume the position shown in FIG. 1A. The action of the resilient wheels 36A/36B on the surfaces 32 and 38 ensures that rotational operation of the shaft 25 in the clockwise direction, as viewed in FIG. 1A, causes the various lever arms of the device to assume the position shown in FIG. 1A. It should be noted that the holding arm 1C) is in alignment with the lever arm 30 when the device is rotated to this position about the various pivots 44, 42, 28, 12 and 24.

Reference now should be made to FIG. 1C. Once the wafer 11, located in the environment on the right-hand side of the loadlock 4, shown in FIG. 1, has completed its processing or initial loading, the shaft 25 is rotated in a counterclockwise direction (as seen in FIG. 1A) to pivot the arm 30 counterclockwise. This pulls the wafer support arm 10 through the opening 16 and folds the apparatus back into the configuration shown in FIG. 1B. At this time, the rotation of the shaft 25 is terminated and the openings 16 and 18 of the loadlock chamber 14 are closed. The chamber then is evacuated in a standard manner. Once the evacuation is completed, opening of the opening slot 18 on the opposite side of the loadlock chamber 14 is effected in a standard manner. At this time, the shaft 25 again is rotated in a counterclockwise direction to pivot the arm 30 to the position shown in FIG. 1C. At the initiation of this rotation, the interaction of the resilient wheels 36A and 36B with the surfaces 32 and 38 shown in FIG. 1B ensures that the lever arm 40 begins to rotate in a counterclockwise direction relative to the lever arm 26B about the pivot 42 to the position shown in FIG. 1C. The arms 26A/26B rotate with the center pivot 28, which is secured to the arms 26A/26B, in the hole in the center of the lever arm 30. The right-hand end of the arm 26A (FIG. 1A) pivots about the sliding pivot 25, as described previously. All of the other parts then rotate about the pivots 42, 44 and 12 to place the various parts in the position shown in FIG. 1C. The support arm 10 extends the wafer 11 to a position outside the loadlock chamber 14 on a straight line diametrically opposite the previous positions shown in dotted lines in FIG. 1C.

It should be noted that the center line of the wafer 11, for all three of the positions shown in FIGS. 1A, 1B and 1C, is a straight line passing through these different positions. This is shown most clearly in FIG. 1C. Thus, the work piece transfer is a smooth and effective transfer from the position shown in FIG. 1A to the center position shown in FIG. 1B, to the third or left-hand position shown in FIG. 1C, and back again for the operation of the transfer mechanism.

It should be noted that contamination of the interior of the loadlock chamber 14 from wear on various parts is kept to a minimum. There is only one shaft 25 which extends through the loadlock 14 to the outside, as described earlier. In addition, there are no gears or belts used anywhere in the apparatus. The entire apparatus works on simple pivots which may include suitable ball bearing pivots secured to the various elements to permit the relative rotations and extensions which are illustrated in the different figures. Since the loads which are carried by the holding arm 10 are extremely light, none of the components forming the various levers 26A/26B, 30, 40 and 10, need to be heavy duty components. At the same time, the tolerances of the various pivots and the lengths of the lever arms are selected to allow precision positioning of the wafers 11 (or other suitable loads) to the different positions which have been illustrated in the drawings. Because no gears or belts are used within the device, the production of minute, dust-like particles caused by the wear of such gears and pulleys has been eliminated or significantly reduced by the use of the various components which have been shown. The sliding pivot 24 on the lever arm 26A allows the elimination of such gears and belts.

In addition to the foregoing, by employing the resilient wheels 36A and 36B in conjunction with the surfaces 32 and 38, unwanted oscillation or vibration is eliminated or substantially reduced when the various components come to the central or rest position, which is illustrated in FIG. 1B and FIG. 2 of the drawings. The resilient wheels 36A and 36B operate as an oscillation damper when the device is moved to the position shown where all of the parts are located within the loadlock chamber 14. This additional benefit is obtained by use of the wheels 36A and 36B in conjunction with the function of the wheels described earlier to ensure that all of the parts move in the proper direction of rotation when movement of the holding arm 10 from the position shown in FIG. 1B to either of the positions shown in FIG. 1A and FIG. 1C is desired.

The foregoing description of the preferred embodiment of the invention is to be considered as illustrative and not as limiting. Various changes and modifications will occur to those skilled in the art for performing substantially the same function, in substantially the same way, to achieve substantially the same result, without departing from the true scope of the invention as defined in the appended claims.

What is claimed is:

1. A workpiece transfer system including in combination:

a housing having a base and first and second sides;

an input drive shaft having an axis and mounted for rotation in the base of said housing;

an elongated guide groove in the base of said housing located on a line passing through the axis of said drive shaft;

a first lever arm having a first predetermined length with first and second surfaces and first and second ends, said first end secured to said drive shaft for rotation therewith, said first lever arm having a hole therethrough substantially at the center thereof;

a workpiece support member pivotally attached to the second end of said first lever arm;

a second lever arm having first and second ends and located adjacent the first surface of said first lever arm, with the first end thereof secured to a support pin extending for rotation through the hole in said first arm and having a guide pin extending outwardly from the second end thereof and extending into said elongated guide groove;

a third lever arm with first and second ends, with the first end thereof secured to said support pin extending from the first end of said second lever arm through the hole in said first lever arm, said third lever arm located adjacent the second surface of said first lever arm;

a fourth lever arm located between said third lever arm and said workpiece support member, said fourth lever arm having first and second ends, with the first end thereof pivotally attached to the second end of said third lever arm and the second end thereof pivotally attached to said workpiece support member at a second predetermined distance from the point of pivotal attachment of said workpiece support member to the second end of said first lever arm.

2. The combination according to claim 1 wherein the interconnections of said second and third lever arms with said pin extending through the hole in said first lever arm constitutes a composite rigid lever arm with a first portion comprised of said second lever arm located in a plane adjacent the first surface of said first lever arm and a second portion comprising said third lever arm located in a plane adjacent the second surface of said first lever arm.

3. The combination according to claim 2 wherein said composite lever arm and said first lever arm are of approximately the same length.

4. The combination according to claim 3 wherein said fourth lever arm has a predetermined length less than said first predetermined length.

5. The combination according to claim 4 wherein said first surface of said first lever arm is a bottom surface thereof and said second surface is a top surface, with said second lever arm located beneath the bottom surface of said first lever arm, said third lever arm located above the top surface of said first lever arm, and said fourth lever arm located between said third lever arm and said workpiece support member, with said pivotal attachment of said second end of said fourth lever arm axially aligned with said support pin extending through the hole in said first lever arm when said transfer system is in a first position of operation.

6. The combination according to claim 5 further including a rotatable wheel member mounted at the center of said third lever arm when said system is in a first position of operation and wherein said first and fourth lever arms have projections extending toward one another on opposite sides of said third lever arm for engagement by said rotatable wheel member.

7. The combination according to claim 6 wherein said wheel comprises resilient surfaces engaging said projections.

8. The combination according to claim 1 further including a rotatable wheel member mounted at the center of said third lever arm when said system is in a first position of operation and wherein said first and fourth lever arms have projection extending toward one another on opposite sides of said third lever arm for engagement by said rotatable wheel member.

9. The combination according to claim 8 wherein said wheel comprises resilient surfaces engaging said projections.

10. The combination according to claim 1 wherein said fourth lever arm has a predetermined length less than said first predetermined length.

11. The combination according to claim 10 wherein said predetermined length of said fourth lever is approximately half said first predetermined length.

12. The combination according to claim 1 wherein said first surface of said first lever arm is a bottom surface thereof and said second surface is a top surface, with said second lever arm located beneath the bottom surface of said first lever arm, said third lever arm located above the top surface of said first lever arm, and said fourth lever arm located between said third lever arm and said workpiece support member, with said pivotal attachment of said second end of said fourth lever arm axially aligned with said support pin extending through the hole in said first lever arm when said transfer system is in a first position of operation.

13. The combination according to claim 12 wherein said first and fourth lever arms have projections extending toward one another on opposite sides of said third lever arm for engagement by a rotatable wheel member mounted at the center of said third lever arm when said system is in a first position of operation.

14. The combination according to claim 13 wherein said wheel comprises resilient surfaces engaging said projections.

* * * * *